United States Patent [19]
Soenen et al.

[11] Patent Number: 5,327,129
[45] Date of Patent: Jul. 5, 1994

[54] ACCURACY BOOTSTRAPPING

[75] Inventors: Eric G. Soenen, Dallas, Tex.; Randall L. Geiger, Boone, Iowa

[73] Assignee: The Texas A&M University System, College Station, Tex.

[21] Appl. No.: 87,943

[22] Filed: Jul. 6, 1993

Related U.S. Application Data

[63] Continuation of Ser. No. 020,892, Feb. 22, 1993, abandoned, which is a continuation of Ser. No. 746,270, Aug. 15, 1991, abandoned.

[51] Int. Cl.$^5$ .............................................. H03M 1/10
[52] U.S. Cl. .................................... 341/120; 341/118; 341/161; 364/571.01; 364/174; 324/615
[58] Field of Search ............... 341/118, 119, 120, 121, 341/144, 155, 156, 161, 162, 163; 324/601, 615; 364/176, 184, 571.01, 571.03, 571.04, 571.05, 571.06, 571.07

[56] References Cited

U.S. PATENT DOCUMENTS

| | | | |
|---|---|---|---|
| 3,638,218 | 1/1972 | Kaneko et al. | 341/118 |
| 4,290,008 | 9/1981 | Hoshino et al. | 324/615 X |
| 4,414,638 | 11/1983 | Talambiras | 364/571.07 |
| 4,468,651 | 8/1984 | Lechner et al. | 341/118 |
| 4,535,318 | 8/1985 | Duryee et al. | 341/118 |
| 4,593,268 | 6/1986 | Blauschild | 341/118 |
| 4,672,566 | 6/1987 | Asano et al. | 364/571.04 |
| 4,745,394 | 5/1988 | Cornett | 341/118 |
| 4,799,041 | 1/1989 | Layton | 341/120 |
| 4,903,026 | 2/1990 | Tiemann et al. | 341/131 |
| 5,047,772 | 9/1991 | Ribner | 341/161 X |
| 5,159,342 | 10/1992 | Yotsuyanagi | 341/161 |

FOREIGN PATENT DOCUMENTS

| | | |
|---|---|---|
| 0275142 | 1/1988 | European Pat. Off. . |
| 0430599 | 11/1990 | European Pat. Off. . |
| 0460840 | 5/2491 | European Pat. Off. . |
| WO 9200630 | 7/1991 | PCT Int'l Appl. . |

*Primary Examiner*—Howard L. Williams
*Attorney, Agent, or Firm*—Mark E. Courtney; Richard L. Donaldson

[57] ABSTRACT

A method and apparatus for a system physically realizing a transfer function and having improved accuracy and fast calibration is described, comprising a plurality of stages configured in a serial fashion, each stage having a transfer function realized with fixed and adjustable elements. Control logic for selectively reconfiguring said stages, operable for coupling any one of said stages to a reference signal and for further coupling said one of said stages to the remaining ones of said stages in a serial fashion is added; control logic for selectively causing said stages to transmit at their output responses to an input which enable measurement of individual components within said stages is included; and control logic for updating the adjustable elements within each stage is described. A calibration technique is disclosed wherein the system is reconfigured to allow any one of said stages to be configured as the first stage in a chain made up of all of said stages, serially coupled, the first stage outputting signals indicative of the value of components within it in response to selective excitation by the reference signal, the remaining stages capturing said outputted signals and storing the result as a measurement.

The calibration process continues until the adjustable elements within each stage have been updated. Additional cycles may be performed for increased accuracy. An additional preferred embodiment of an analog-to-digital converter implemented using the accuracy bootstrapping invention is disclosed. Other embodiments are also disclosed.

41 Claims, 8 Drawing Sheets

ACCURACY BOOTSTRAPPING

This application is a continuation of application Ser. No. 08/020,892, filed Feb. 22, 1993, now abandoned; which is a continuation of application Ser. No. 07/746,270, filed Aug. 15, 1991 now abandoned.

FIELD OF THE INVENTION

This invention generally relates to a technique for improving the calibration and overall accuracy of a system (electrical, mechanical, or other) which is designed to physically realize a deterministic response to a certain input excitation.

BACKGROUND OF THE INVENTION

Without limiting the scope of the invention, its background is described first in terms of general system design and second in connection with a system which implements an analog-to digital converter function, as an example.

Heretofore, in the field of system design in general, there have been several approaches to designing extremely accurate systems and/or correcting inaccuracies which arise after the system is physically realized. Some typical approaches are: feed-back, wherein a scaled version of the output is continuously fed back and compared to the input, and the difference or error is used to correct the system or the output so that the desired output is achieved; correlated double sampling, wherein a zero or reference input is sampled between sampling of the input data stream, and the output used is calculated as the difference of the output generated by the reference and the output generated by the input data; look-up tables, which are used to adjust the parameters of the transfer function and thereby improve system performance; histogram analysis, wherein a deterministic or random input signal is applied to the system and the output is observed to determine its actual transfer function, this information is then used to drive compensating logic or functions; neural networks which implement a system by training a network using feedback with adjustable parameters to obtain a desired output response for a specific or set of specific input responses.

Some of the problems faced by the prior art approaches have been that many of the techniques listed above require measurements of the transfer function of the system with components which are more precise than the system itself, or alternatively operate to attempt to drive the components to their designed values through self-calibration techniques.

If the system is designed to attempt to control the component values, the precision possible is limited by the accuracy of the components. If the system uses digital error correction techniques, greater precision is possible but the values of the components must be physically measured. If the system is a closed system, such as an integrated circuit, measurements may be impossible or costly, or require actual fabrication of the measuring hardware- which is in fact a more accurate system; perhaps requiring accuracy beyond that available with the state of the art.

Even if the system is measured and precisely calibrated at the outset, the components will in time experience drift. The device must be periodically recalibrated, and the result is that it may be necessary for the precise measuring device to remain in place.

Other calibration approaches require continuous error correction calculations, which interfere with and limit the rate at which the devices can accept incoming data. Some approaches require precise reference signals to be available. Finally, all of the above approaches are limited to the inherent inaccuracy of the calibration components. This fundamental limit forms an obstacle to the development of highly accurate, high-speed systems. In the example of analog-to-digital or ADC circuitry, this limit appears to prevent the development of converters that are highly accurate ($>10$ bits) and high speed (tens of Mhz) converters. Accordingly, improvements which overcome any or all of the problems are presently desirable.

SUMMARY OF THE INVENTION

Generally, and in one form of the invention, a system is described which implements a transfer function, having stages each with an individual transfer function, the stages being reconfigurable so as to enable the creation of various serial combinations, meaning that the output of one stage may be used as the input to some of the other stages (that is, any stage in the series may be configured so as to be first in the series, with the other stages chained together so as to follow it.)

The system has a calibration mode, wherein a single stage is placed first in the chain, and the other stages are placed behind it. The components of the first stage are then estimated using the remaining, uncalibrated stages to perform the measurement of the variation in the values of the fixed components of the first stage, or alternatively the actual values of the fixed components of the first stage. This information is stored and used to calibrate or adjust the adjustable parameters of the first stage. The chain or series is reconfigured, so that another uncalibrated stage is first, followed by the stage just calibrated, followed by the rest of the series. The measurement is then made of the fixed components of the next stage, and these values are stored and used to calibrate the output of the next stage.

This process continues until finally the first stage is placed first, and the other stages are placed in their natural numbered order, so that the stages measuring the fixed component values of the first stage are those stages already having their outputs calibrated using the measured values previously generated.

This process can be repeated, in an iterative fashion, until no measured values change between iterations, for maximum accuracy. In this way, the system measures itself without additional measuring or reference hardware or signals; and without the need of external hardware or signals.

This technique has been successfully applied to a system realizing an analog-to-digital converter and has been shown to converge for a wide range of design parameters and to create highly accurate results using inaccurate components. The converter thus designed is advantageously extremely fast to calibrate.

A further embodiment is described wherein a single stage system is calibrated using accuracy bootstrapping. In this embodiment, the single stage is calibrated in a recycling mode, so that it measures its own fixed components; and the recycling feature of the system enables the system to emulate a multiple stage system, with results as discussed above.

An advantage of the invention is that precise system results are achieved without the need for either precise in-system components or precise measuring devices.

The invention allows the realization of highly accurate systems beyond the capability of systems designed using the prior art.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Accuracy bootstrapping makes it possible to design systems with very accurate control over their transfer functions. The transfer function expresses a relationship between the system input and the system output. The exact type of input and output used may vary, for example voltage, current, pulses, digital codes, pressure, temperature, charge may be used.

Whenever a system is built using physical components to realize the designed transfer function, the transfer function of the actual system is subject to a certain amount of inaccuracy or imprecision due to the fact that it is impossible to realize components whose size or value exactly match the nominal, designed for, values. There is always error in the physical realization of the system due to the tolerance on the value of the resistances, capacitances, inductances, weights, elasticity, size, etc. of components used in the system.

Accuracy bootstrapping performs two functions which lead to accurate output in spite of these tolerances or errors in component values. First, the system is measured through a process called system identification; that is the determining of either the error or actual component values, and second the system is calibrated through compensation using the adjustable parameters in the system; the adjustable parameters are quantities that could be binary codes stored in a digital memory element, voltages stored on capacitors, residual magnetic fields, or other quantities that are stored. Accuracy bootstrapping starts out with an inaccurate system, and gradually adjusts, calibrates or refines the system until a desired accuracy level is reached, in other words until the system accurately produces the designed-for transfer function within the tolerance desired. No external measuring system or highly precise components are required, no external reference system is required, the system is self-calibrating.

Because accuracy bootstrapping relies only on the components in the system itself for the system identification step, the following non-limiting conditions are placed on the system:

first, the system should be designed in such a way that the blocks, stages, or sub-systems within the system, each with its own input, output and local transfer function, can be re-ordered; that is the system will be reconfigured so that different outputs of stages or subsystems can be connected to different inputs of other stages in the system;

second, sufficient control of the reconfiguration must be possible so that several different configurations can be realized successively, this is normally accomplished by consecutively applying different combinations of signals to provide a control sequence which could be provided by an internal part of the system or by an external controller;

third, the system should make it possible to apply reference signals as inputs to a particular block instead of the outputs of the preceding block or stage; alternatively the controller or sequencer should be able to apply control signals so that within a particular block one of several possible modes of operation is selected, this is necessary so that measurements can be made which identify the individual components response to excitation and the impact on the transfer function of the block;

fourth, the transfer function of at least some of the individual blocks, and preferably all of the individual blocks, are such that the output of the block can be modified or adjusted by changing the value of one or more adjustable parameters within the block; that is that the block normally has a transfer function determined by three components: fixed components subject to random variations, control signals, and adjustable elements;

finally, the overall, nominal transfer function of the system is realized by a particular configuration of blocks; one convenient configuration is a linear or serial configuration with the system input going into one end of the line of blocks and the output taken from the last block in the line, but other configurations do not prevent the use of the accuracy bootstrapping technique, and subsystems within systems may use the technique where the technique cannot be conveniently applied to the system as a whole.

Figure 1:
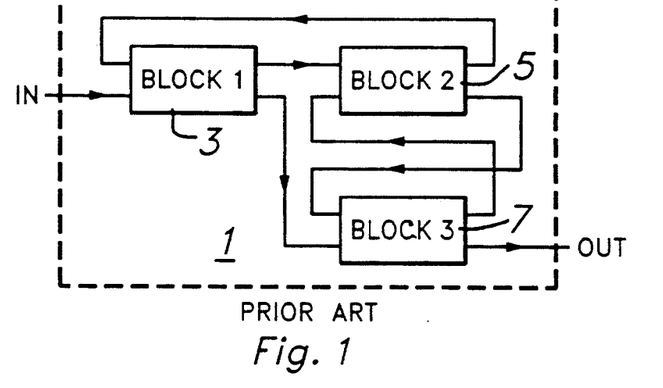
FIG. 1 is a block diagram of a typically configured system.

In FIG. 1, a system 1 implementing a function on an input to create an output is depicted, organized in a serial fashion. Stage 3, labeled block 1, is the first stage in the serial chain. Stage 5, labeled block 2, is coupled to stage 3. Stage 7, labeled block 3, is the last stage in the chain. This represents a typical system block diagram for implementing an arbitrary transfer function. It is possible, but not necessary, that one or more outputs of one block will be input to the same block. This is common in some classes of systems, for instance, discrete time systems wherein the block has an internal storage device which holds a signal for use in the next cycle.

Figure 2:
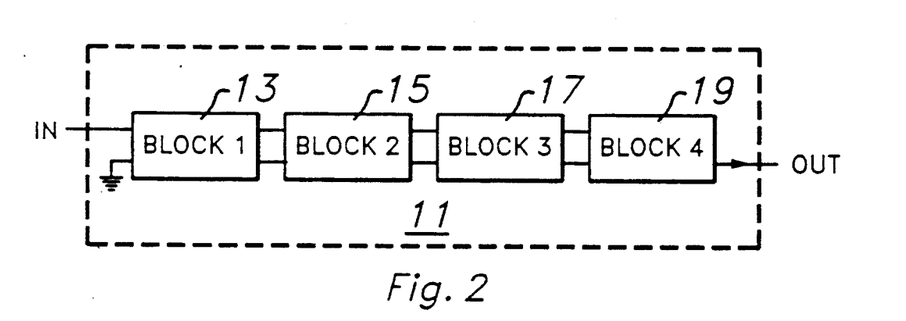
FIG. 2 is a block diagram of a system organized in a linear configuration.

FIG. 2 depicts a system 11 which is organized in a linear configuration. Stage 13, labeled as block 1, is the first stage in the chain. Stage 15, labeled block 2, is the second stage. Stage 17, labeled block 3, is the third stage. Finally stage 19, labeled block 4, is the last stage. Together the stages implement the system transfer function.

It is obvious to one skilled in the art that by rearranging the system depicted in FIG. 1, and modifying the internal block transfer systems, the transfer function of the system in FIG. I can be realized by the system depicted in FIG. 2. Although accuracy bootstrapping could be applied to either the system depicted in FIG. 1 or FIG. 2, the system in FIG. 2 will more naturally lend itself to the application of the invention.

Figure 3:
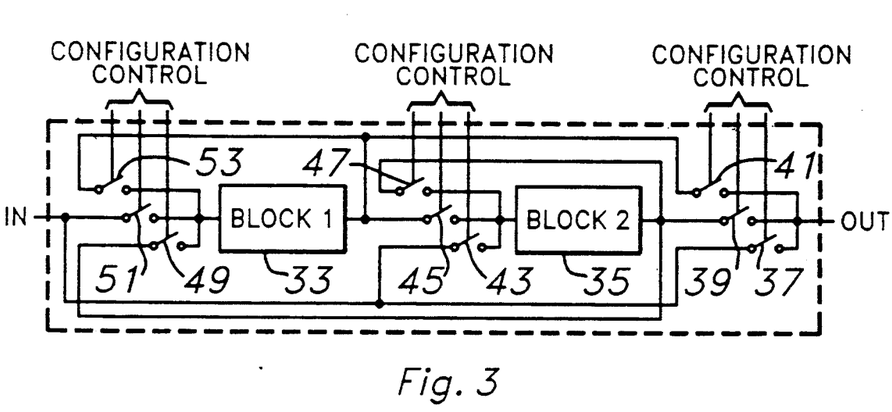
FIG. 3 is a block diagram of a serially configured system having the reconfiguration capability needed for accuracy bootstrapping.

FIG. 3 depicts a system 31 organized to use the accuracy bootstrapping technique of the invention. Stage 33, labeled block 1, is the first stage in a two stage chain. Stage 35, labeled block 2, is the second stage. Switches 37, 39 and 41 are used to reconfigure the output so that it is selectively driven by stage 35, stage 33, or the input. Switches 49, 51 and 53 are used to reconfigure the input to stage 33 so that it is selectively driven by the output of stage 35, the output of stage 33, or the input. Switches 43, 45 and 47 are used to reconfigure the input to stage 35 so that it is selectively driven by the output of stage 35, the output of stage 33, or the input. Each of the switches is controlled by configuration control lines.

Figure 4:
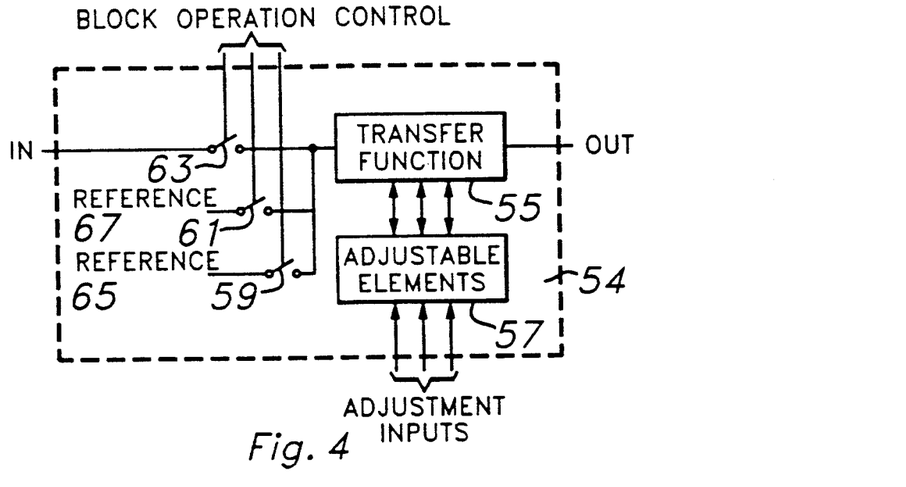
FIG. 4 is a block diagram of a single stage in a serially configured system embodying the invention.

FIG. 4 depicts the schematic diagram of a single block or stage 54 for the system of FIG. 3. The components in the block are now split into the transfer function having fixed components 55 and adjustable elements 57. Switches 59, 61, and 63 are used to selectively couple the input of the transfer function to reference input 65, reference input 67, or the input signal, respectively.

It is normally possible to apply control signals to the system so that the input of some blocks will be coupled to one of a number of reference signals, rather than to the output of another block. The purpose of applying the different reference signals is to excite different degrees of freedom of the block transfer function, so that measurements can be made which will identify the actual values of the individual components affecting the transfer function. Typically the control of the system will be performed by a controller or sequencer, which is conveniently implemented as digital or general purpose logic circuitry, and may be built into the system or provided externally.

Figure 5:
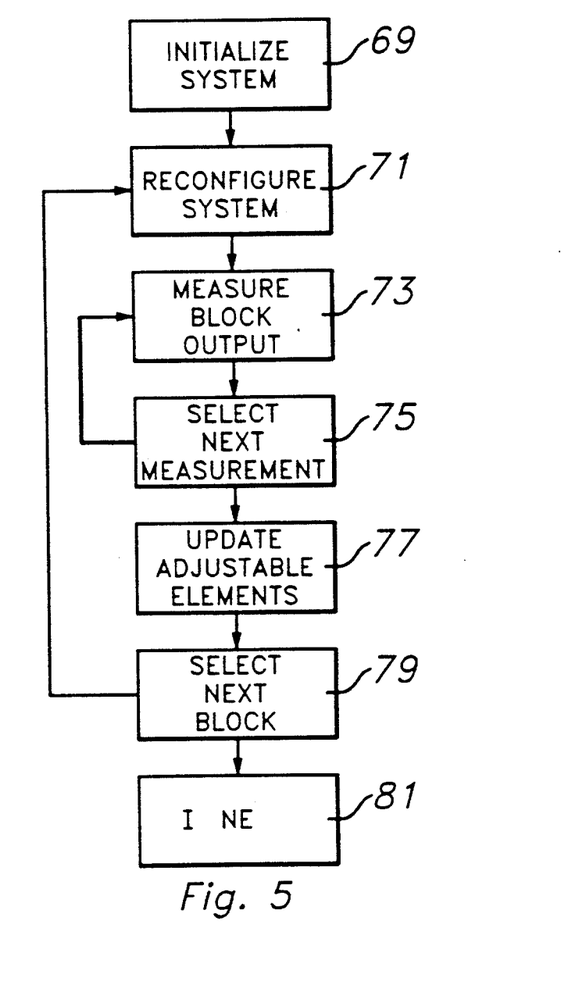
FIG. 5 is a block diagram the steps used in calibration of a system embodying the invention of FIG. 4.

FIG. 5 depicts the steps used to calibrate a system using accuracy bootstrapping. In step 69, initial values are assigned to the adjustable elements of the different blocks in the system. In step 71, a particular configuration of blocks is realized so that the input of one block, the block being calibrated, is connected to a reference signal, while the output of the block being calibrated is connected to a sequence of the other blocks. In a discrete time system, it is possible that the block under calibration can be used for measurement as well, as the output of that block can be fed back into the input of that block during the time frame following the time frame in which the reference is applied.

In step 73, the output of the block being calibrated is measured by the pipeline formed by the remaining blocks. In step 75, the control lines to the block are operated so as to make the next measurement, if more than one measurement is required. In step 77, the measurements made for the block in calibration are used to update the adjustable elements for that block. The adjustable elements or values may be stored in a memory comprised of digital logic, on a capacitor, in a residual magnetic field, as potential energy, or by other methods. When the adjustable elements are numerical data stored as numbers in a digital memory, the process of repititively updating these data can be performed by a digital logic circuit or machine, which may be implemented as a dedicated electronic circuit or as a general purpose computer or microprocessor. In that case, the digital machine is part of the hardware used in the system to implement accuracy bootstrapping, even if the circuit is external to the machine being calibrated. In step 79, the next block to be calibrated is identified. Once all of the blocks have been calibrated, step 81 is reached and the calibration is complete if one iteration is sufficient. In some systems, the process is repeated starting at step 71 until the desired accuracy is attained. When the control of the calibration cycle is performed by a digital controller or general purpose computer, the steps in FIG. 5 represent the programming tasks and decisions required by the controller.

Figure 6:
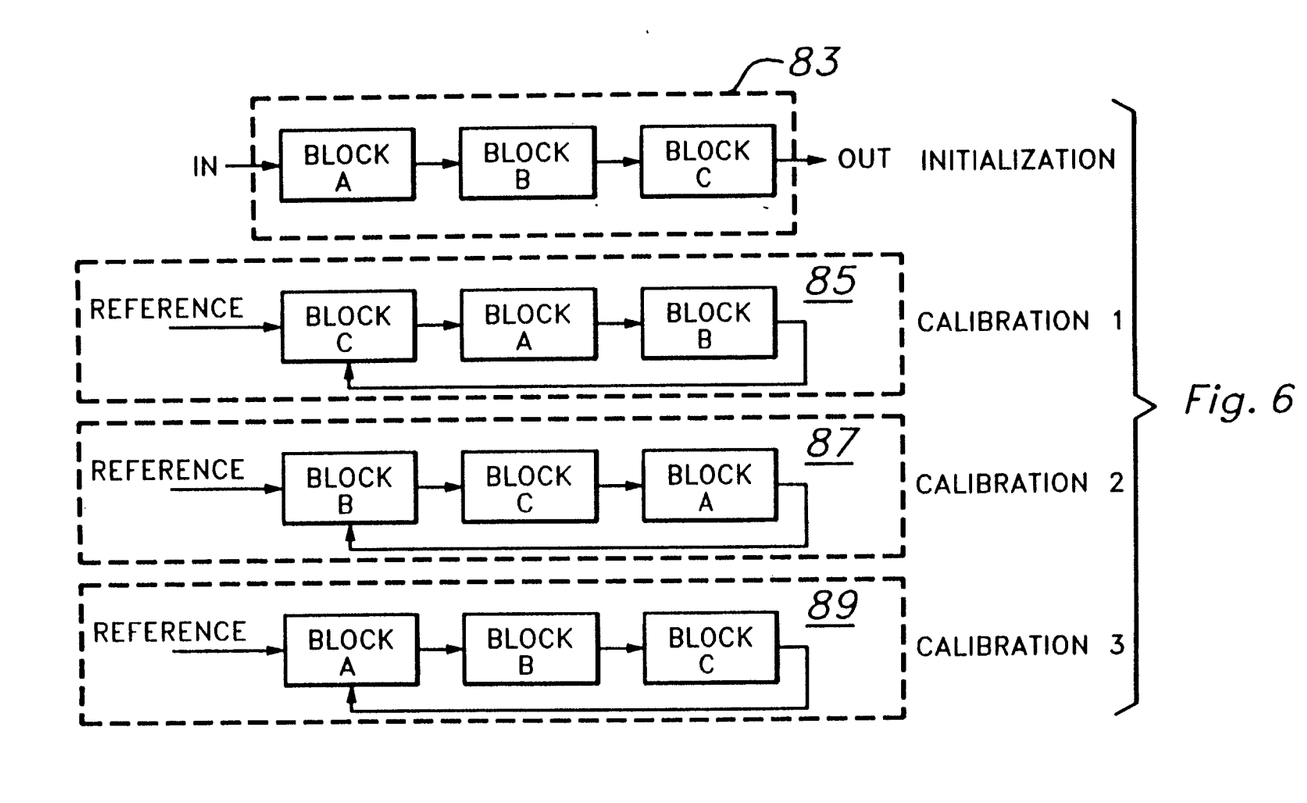
FIG. 6 is a diagram depicting the reconfiguration steps of a system during calibration using accuracy bootstrapping.

FIG. 6 depicts the steps of FIG. 5 applied to a hypothetical three stage pipelined system having blocks A, B and C. Initialization configuration 83 is used to setup the pipeline for calibration. First calibration configuration 85 moves the last block, block C, to the first position in the pipeline and blocks A and B are used to make the measurement. The output of the measurement is used to update the adjustable elements within block C. Second calibration configuration 87 is used to calibrate block B. Finally, the last calibration configuration 89 is used to calibrate block A. This process can be repeated if necessary.

Under certain conditions, which are taken into account when the system is designed, this process will evolve into a situation where the adjustable or variable elements of the different blocks do not change with additional iterations. In a particular case, this means that all of the blocks have been adjusted so as to reach a well-determined transfer function, unaffected by the random variations in component values which are inherently present in the fixed components used in each block. This equilibrium situation is equivalent to having adjusted the adjustable components of the blocks so as to cancel the effect of random variations in the fixed components. Once this situation is reached, the overall transfer function of the system can be operated by configuring the blocks in their normal order between the input and the output of the system.

It may seem unlikely that a system can be made more accurate by repeatedly measuring itself. Consider the following intuitive explanation, applied to the system described above as an example. In the first calibration step the last stage of the pipelined system is calibrated by measuring its output using the remaining, uncalibrated pipeline stages which are reconfigured to follow it. For those uncalibrated stages the initial values of the adjustable parameters are chosen as the designed-for or expected values. Even if all of the components in this virtual pipeline have random errors of up to 5%, it turns out the intrinsic accuracy of the uncalibrated pipeline for some systems (those systems having the necessary characteristics) is better than 5%, because the errors on the components exhibit a tendency to interact favorably with one another. This is especially true if the stages in the pipeline are similar or replicated, as the output of one stage will have similar values to the output of another.

In the second step of the first iteration, the characteristic component values of the next to last stage in the pipeline are measured using a pipeline formed by the calibrated last stage followed by the remaining uncalibrated stages. Since the first and most significant part of the measurement is made by the calibrated last stage, the measurement for the next to last stage will be more accurate than the first measurement. This process continues iteratively, and one can see that the accuracy of the adjustable parameter updating process is increasing as the accuracy bootstrapping loop works towards the first stage in the pipeline, so when the first stage is measured it will end up with the most accurate adjustable parameters, The input to the system hits the most accurately adjusted stage first, and for most systems this stage will have the largest impact on the overall accuracy of the system transfer function. This is an improvement over the uncalibrated pipeline so long as the accuracy bootstrapping technique exhibits increasing accuracy through the iterative calibration process for the system.

The following iterations repeat the process, but with increasingly better characterized stages performing the measurement for the stage being calibrated, which is inherently bound to produce increasingly accurate results. For a system wherein the components and known possible errors on the components are selected so that the accuracy does in fact increase, which is easily demonstrated by well-known simulation and design evaluation techniques, it is clear that eventually the values for the adjustable parameters will settle and further iterations will not produce any changes. At this point the transfer function of the system will reflect the maximum possible accuracy of the particular system (i.e. the error will be minimized).

In systems which do not exhibit component drift, the system can now be operated continuously with the maximum accuracy. However, in many systems component values (or errors) will tend to change over time or with changes in ambient temperature or other conditions. In those cases periodic recalibration will bring the system back to a maximally accurate transfer function.

One preferred embodiment of a system using accuracy bootstrapping which has been shown to produce accurate results far greater than that of the prior art is an analog-to-digital converter.

Figures 7, 9:
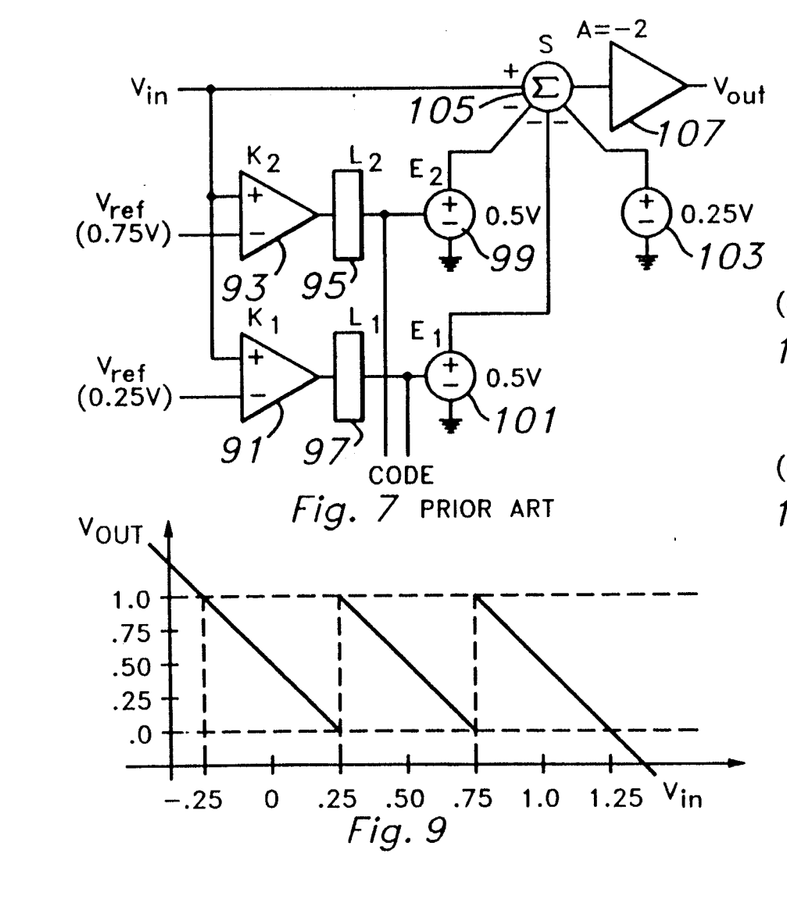
FIG. 7 is a stage of a typical pipelined analog-to-digital converter.
FIG. 9 is a voltage transfer curve for the analog-to-digital stage of FIG. 8.

FIG. 7 depicts a single stage of a pipelined analog-to-digital converter system of the prior art. Comparator 93 compares the input to a reference voltage, here 0.75 volts is chosen. Comparator 91 compares the input to a second reference voltage, here 0.25 volts is chosen. Latch 95 stores the compare result from comparator 93. Latch 97 stores the compare result of comparator 91. The outputs of the latches 95 and 97 are output as a digital code. Voltage source 99 is enabled/disabled by the value stored in latch 95. Voltage source 101 is enable/disabled by the value stored in latch 97. Offset voltage 103 is coupled to summer 105. Summer 105 takes the input voltage and subtracts 0.25 volts as well as selectively subtracting the voltage of sources 99 and 101 based on the values stored in latches 95 and 97. The summer 105 output is amplified by amplifier 107, this output is sent on to the next stage in the pipeline for further conversion.

Figure 8:
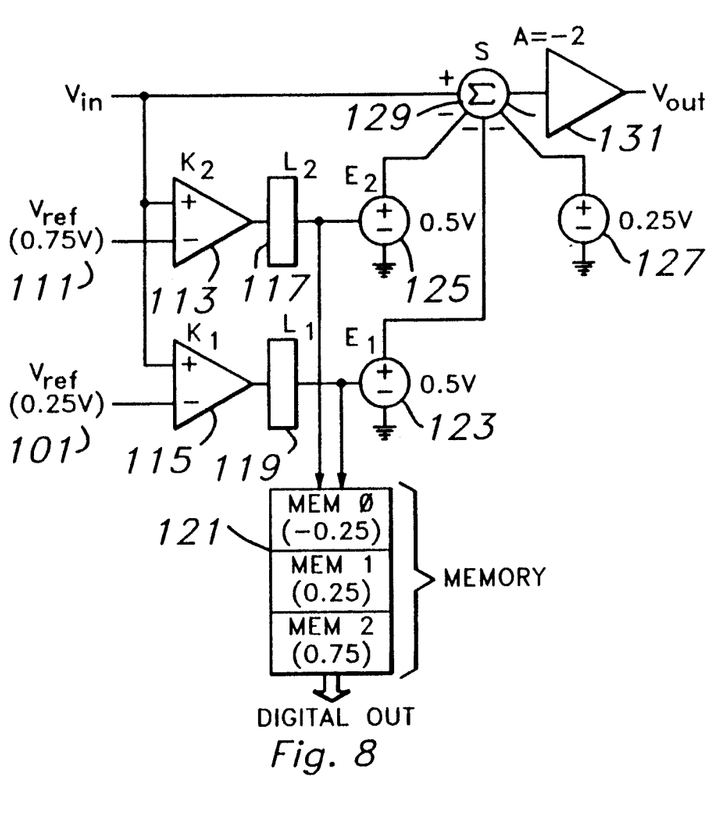
FIG. 8 is a schematic of a single stage of an analog to digital converter having a digital memory.

FIG. 8 depicts a single stage for a system for implementing the analog-to-digital converter system using digital coefficient memory. The input signal $V_{in}$ is a voltage, nominally within the range of 0-1 Volts. This input signal is compared to two reference voltages 109 and 111, nominally set at 0.25 and 0.75 Volts each, using comparators 113 and 115. The result of the two comparisons is stored as a two bit code in latches 117 and 119. The output of these latches is therefore a binary code which depends on the values of the input signal. For an input less than 0.25V the code should be '00', for an input between 0.25V and 0.75V the code should be '01', and for an input voltage greater than 0.75V the code should be '11'. This form of code is known as a thermometer coding.

Depending on the code which results in the comparison, voltages are subtracted from the input signal to generate the residue for the next stage. This is done using switchable voltage sources 125 and 123 and summer 129. A fixed voltage of 0.25V is always subtracted from the input signal, regardless of the input voltage. As a result, the total subtracted voltage can be 0.25V, 0.75V, or 1.25V, for codes of '00', '01' and '11' respectively.

The summer 129 is coupled to a sample/hold amplifier 131 which has a nominal gain of $-2$. The components used in the amplifier are chosen so that the amplifier output has a nominal range of 0-1V. The stage is built to include a $+/-25\%$ safety margin, since an input of 1.25V will yield an output of 0V and an input of $-0.25$V will yield an output of 1V. This margin or redundancy is built in to the stage so as to permit the stage to operate correctly, even in the presence of component errors.

The code stored in latches 117 and 119 is used to address the memory 121. The values stored in the three locations in the memory (nominally digital representations of 0.25, 0.75 and 1.25) are the adjustable parameters of the stage.

FIG. 9 depicts the nominal voltage transfer curve for the analog input and analog output of the stage shown in FIG. 8.

The main component errors affecting the transfer function of the stage in FIG. 8 are:
incorrect values of the reference voltages (0.25V, 0.75V in this case);
systematic offsets on the comparator switching levels;
incorrect values on the subtracted voltages;
incorrect gain of the sample/hold amplifier;
offset in the sample/hold amplifier;
incorrect error or gain in the summer;
These component errors can be grouped into three classes:
incorrect comparator switching levels;
incorrect subtracted voltages;
incorrect gain.

Accuracy bootstrapping can adjust the coefficients stored in the digital memory for each stage so as to compensate the output for these errors.

The operation of the stage depicted in FIG. 8 can be described mathematically as follows:

$$V_{out} = (V_{input} - V_{cd})A$$

where A is the gain of the amplifier and $V_{cd}$ is the voltage due to the code applied to the switchable voltage sources. This equation may be rearranged to express the input voltage as a function of the coded voltage:

$$V_{input} = V_{cd} + \frac{V_{out}}{A}$$

This stage is then used as part of a pipelined system to implement an A/D converter. In this scheme, a number of nominally identical stages are cascaded behind one another, with the output of the first stage being the input of the next, etc.

The previous expression can then be expanded to represent the input voltage in terms of the coded voltages of multiple stages, as:

$$V_{input1} = V_{cd1} + \frac{V_{cd2}}{A_1} + \frac{V_{out2}}{A_1 A_2}$$

This expression can be extended for a 16 stage converter (which is designed for a theoretical accuracy of 16 bits) as:

$$V_{input} = V_{cd1} + \frac{V_{cd2}}{A_1} + \cdots \frac{V_{cd16}}{A_1 A_2 \ldots A_{15}} + \frac{V_{out}}{A_1 A_2 \ldots A_{16}}$$

The last term in the previous expression is called the residue of the conversion, and is clearly negligible compared to the input voltage range. The output codes of each stage can be used to create a digital conversion result, according to the previous expression. This is accomplished by using the codes to access one out of three possible memory locations, of which the digital output represents one of the terms of the equation. Each stage now has two inputs, (one digital, one analog) and two outputs (also one digital, one analog).

Figure 10:
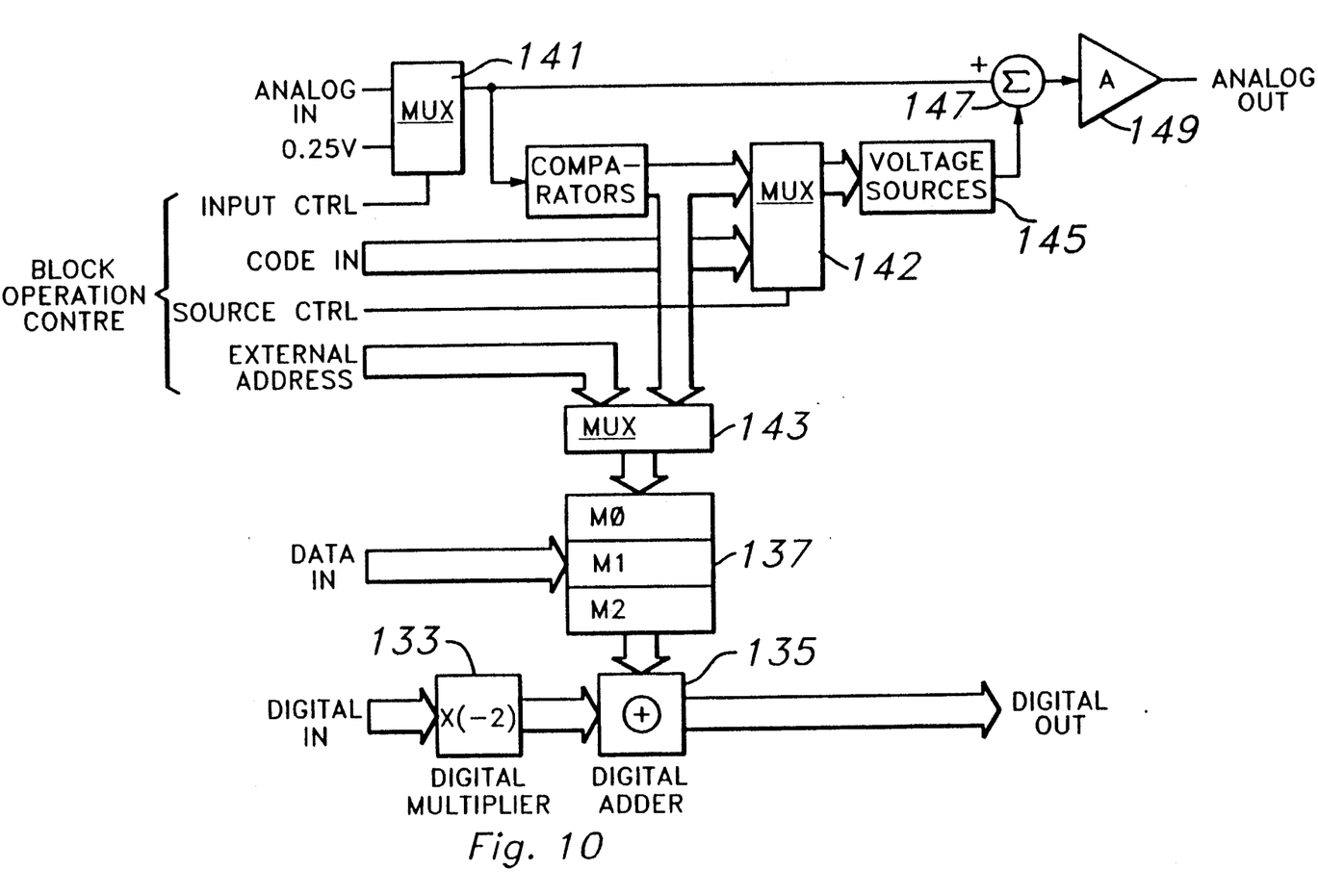
FIG. 10 is a schematic diagram of a single stage for a pipelined analog-to-digital converter using accuracy bootstrapping.

FIG. 10 depicts an analog-to-digital converter stage like that in FIG. 8 but with additional hardware for accuracy bootstrapping. This stage is used in a system to implement a 16 stage converter. Digital multiplier 133 is coupled to the digital output from the previous stage, which is the contents of the location in the digital memory addressed by the comparator code currently in the previous stage. Digital adder 135 is used to combine the digital outputs of the previous stages with the digital outputs of this stage, so that the digital output of the last stage is the total conversion result. Digital memory 137 stores the adjustable elements of this stage. Comparators 139 contain the comparators and latches for computing the coded value of the analog input to the stage. Voltage sources 145 contain the switchable voltage sources which will be activated based on the code sourced by the comparators 139. Summer 147 subtracts the output of the voltage sources 145 from the input voltage for computing the residue for the next stage. Amplifier 149 amplifies the output of the summer 147 to maintain the proper voltage range for the next stage. Multiplexer 141 is used to select between the normal stage input and a reference voltage for calibration. Multiplexer 143 is used to allow the digital memory to be externally addressed for initialization and updating of the contents of the memory. Multiplexer 142 is used to allow external enabling of the individual voltage sources for measurement during the calibration cycle.

Each stage represents one term in the equation derived for $V_{in}$ in above. Because the digital output of each stage is scaled up by a factor of $-2$ in the digital multiplier 133 of the following stage, the coefficients stored in the digital memory 137 are scaled down by dividing them by $-2^{15}$. It can be shown that the resulting digital output represents the equation for $V_{in}$, above.

The 16-stage pipelined converter is obtained by combining 16 of the stages shown in FIG. 10. The values for the components and the gains in the system are chosen such that during the calibration cycle the precision of the adjustable elements increases. The analog input of the first stage is the overall input of the system. The analog output of the last stage is unused since it represents the negligible residue term. The digital input of the first stage is connected to a pattern of zeros, while the digital output of the last stage represents the conversion result. One can verify that if all components in the pipeline were accurate (i.e., nominal values were obtained), the equation above would be implemented by storing the values $0.25/(-2)^{15}$, $0.75/(-2)^{15}$ and $1.25/(-2)^{15}$ in the respective memory locations for each stage.

Due to random component errors, however, different values (coefficients) are required for each stage in the memory locations. These are the adjustable parameters for each stage. These values could be calculated if all of the actual component values were known, but in practice this is not desirable; it requires physical measurement of the components (which may be included in a closed system) and requires accurate measuring hardware perhaps beyond what is available. In this particular case, accuracy bootstrapping will determine the values of the coefficients to a 16 bit accuracy, even in the presence of a several % error on all physical components.

In order to apply the accuracy bootstrapping technique to the pipeline of made up of the stages of FIG. 10, the adjustable parameters will be the stored values stored in the three memory locations and accessed by the comparator output code of each stage. At the initial step of the calibration cycle, these stored values will be set to their nominal values of $0.25/2^{15}$, $0.75/2^{15}$ and $1.25/2^{15}$ for use as starting values. Since there is a mismatch between the initial values of the coefficients and actual values which will eventually be stored, the pipeline is initially very inaccurate (perhaps accurate to 6 or 7 bits instead of the designed for accuracy of 16 bits).

The accuracy bootstrapping calibration cycle is performed using a sequencing controller, which will successively reconfigure the pipeline and use some stages to measure and update the coefficients of the stage being calibrated. Realization of the different configurations required is straightforward, as the pipeline for this system is always configured in a cyclic fashion, with the output of the stage which is currently last feeding back into the first stage. The controller only needs to decide which block is the current block to be calibrated. Once that is done, the reconfiguration is easily accomplished and the measurement can take place. In order to accomplish this, the subtracted voltages are controlled externally by multiplexer 142 instead of through the comparator output codes. This enables different measurements so that the contribution and error of each voltage source can be measured. Switching circuitry (multiplexer 141) is added so that it is possible to select a fixed reference level as an input instead of the analog input; in this case 0.25V is used, this value does need to be highly precise.

The calibration cycle starts with the last stage in the pipeline, for a 16 stage pipeline this is stage 16. The analog output of stage 16 is coupled to the analog input of the first stage, stage 1. The analog input of the last stage is coupled to the reference voltage, here 0.25 volts. For the first measurement, none of the switchable voltage sources is enabled. The remaining 15 stages, as well as the comparator outputs of stage 16, are now used to measure the output of stage 16. The resulting conversion output, which will be referred to as N1, is stored.

The next step in the calibration of stage 16 is to enable the first voltage source, so that its value can be reflected at the output and measured. The result of this conversion result is stored and labeled as N2.

Finally the second voltage source of stage 16 is enabled. The resulting conversion is stored as measurement N3.

These three measurements make it possible to estimate the actual values of the two voltage sources. The first voltage source coefficient, nominally $(0.25/(-2)^{15})$, is replaced by the quantity equal to $(N1-(N1-N2))/(-2)^{15}$. The second voltage source, nominally equal to $(0.75/(-2)^{15})$, is replaced by the quantity $N1/(-2)^{15}$. The third one, nominally $1.25/(-2)^{15}$, is replaced by $(N1+(N1-N3))/(-2)^{15}$. This information is then used to update the adjustable parameters for stage 16.

The adjustable parameters could by kept in a memory inside a computer, or in other memory external to the stages. The controller logic could contain the memory, or be replaced by an ASIC or other general purpose logic or devices. Computation of the parameter updates could be performed by dedicated logic or by a general purpose controller or microprocessor. The multiplier shown in the figure could also be replaced or eliminated when the digital portions of the A/D converter are implemented externally. In practice, a local controller for the reconfiguration and measurement selection circuitry is probably preferable, due to the large number of connections which would be required to an external machine.

After stage 16 has been calibrated (i.e. the adjustable values have been updated and stored in memory 137), the process is repeated with stage 15 as the stage being calibrated, stage 16 following it, and the remaining stages following. The three measurements are now taken for stage 15, the coefficients computed and stored. This process is repeated until finally stage 1 is calibrated with all of the previously calibrated stages. For this example, it has been shown that the first iteration on all of the stages will yield an accuracy of 15-16 bits. Additional iterations will achieve the maximum accuracy of 16 bits. In other systems, many iterations may be required to achieve the required accuracy.

In computer simulations the pipelined analog-to-digital converter discussed above has been shown to achieve successful calibration up to the 15 bit level or beyond in each of over 1000 experiments. The simulations were performed using a random number generator to mimic up to 2% uncertainty on all components. A 24 stage pipelined ADC has been observed to be successfully calibrated for all experiments performed, as well. Similar results have been observed using other length pipelines where each stage had two comparators and a gain of two.

Successful calibration has also been observed for pipelines with stages that had a different number of comparators, or a different gain. Successful calibration has been observed for comparators having a gain other than a power of 2, such as 1.9. However, it has been observed that some combinations do not have a 100% successful calibration rate. In general, the success rate goes down for higher gains (3, 4 . . . ). Calibration results also seem to be less favorable for positive than negative gains. It appears that successful calibration is certain for configurations wherein the gain is greater than 1 but less than 2.

Figure 11:
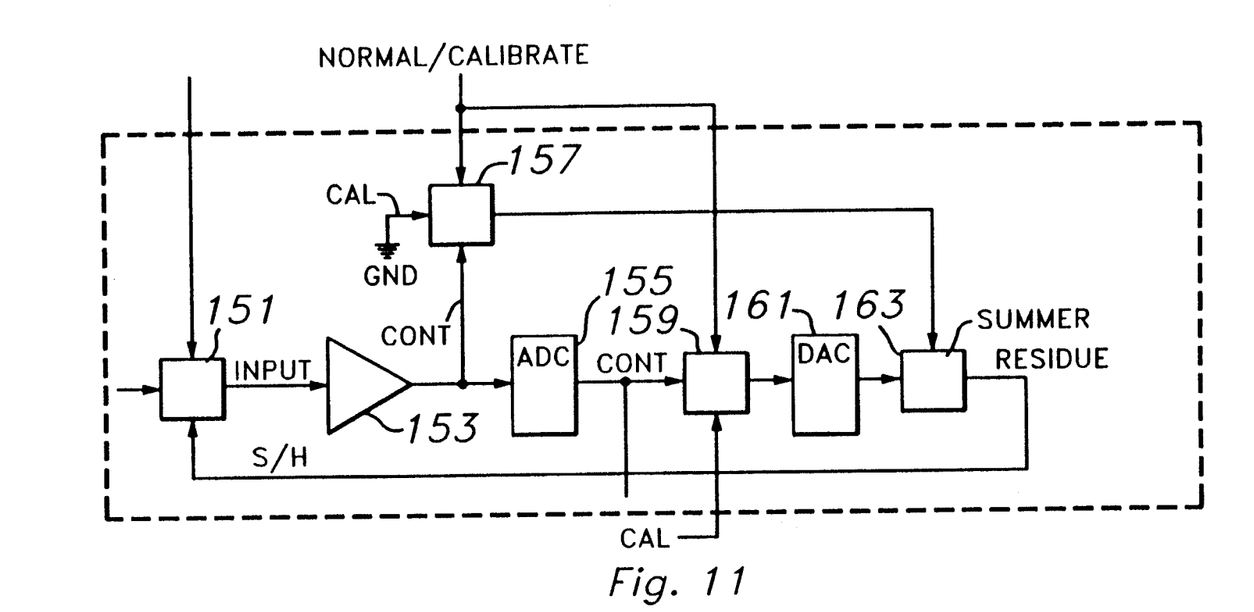
FIG. 11 is a schematic diagram of a recycling analog-to-digital converter using accuracy bootstrapping.

FIG. 11 depicts an alternative embodiment wherein the pipelined stage of the previous embodiment is reconfigured as a single stage with recycling. Switching circuitry 151 selects between the input and the feedback residue from the previous cycle. Sample/Hold amplifier 153 takes the input and samples it for conversion. Switching circuitry 157 selects between the sampled input and a reference voltage for the calibration cycle for the summer input. Analog-to-digital comparators 155 compare the sampled input to reference voltages and create coded outputs. Switching circuitry 159 selects between the coded values and the calibration control enabling values for the voltage sources inside digital-to-analog converters 161. Summer 163 subtracts the output of the digital-to-analog converter section 161 from the sampled input to create the residue for the next cycle. Note that by its nature the recycling analog-to-digital converter is a discrete time system, with storage between cycles.

The digital memory and coefficients are not shown in FIG. 11, this is done externally for this example, although local storage is possible as before.

Accuracy bootstrapping is applied by adding an intermediate storage for the output of a given component, which is then measured by the stage; this process is repeated until all components have been measured and the corresponding adjustable parameters updated. In other words, in the recycling configuration of FIG. 11, the single stage calibrates itself. In some respects it is intuitively clear that the calibration process is faster, as a single stage has fewer components which require measurement than multiple stage devices.

Figure 11A:
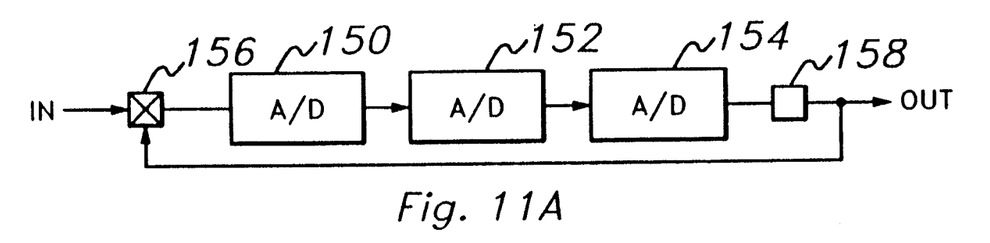
FIG. 11A is a block diagram of a hybrid recycling converter using accuracy bootstrapping.

Hybrid pipelined converters have also been successfully calibrated in simulation. Here, a short length pipeline such as 3 or 4 stages in operated in a recycling mode, that is all of the adjustable parameters are updated for each cycle. FIG. 11A depicts a block diagram of the hybrid pipelined converter using a three stage pipeline. Stages 150, 152 and 154 are analog-to-digital converters as in FIG. 11. Switching circuitry 156 selectively couples the input of the first converter to either a recycled output of the last stage 154 or an analog input. Storage element 158 provides storage between cycles.

One additional class of errors which could be addressed by accuracy bootstrapping is amplifier non-linearity. In the example above, the amplifiers in the A/D converter were ass-reed to be linear; so that the accuracy bootstrapping technique did not address a case where non-linear amplifier errors occur. This could be addressed by using a piece-wise linear or polynomial approximation for the gain of the amplifier, and adding this measurement to the accuracy bootstrapping measurement, storing and updating the adjustable parameters as needed to compensate the system for these errors as well.

Figure 12:
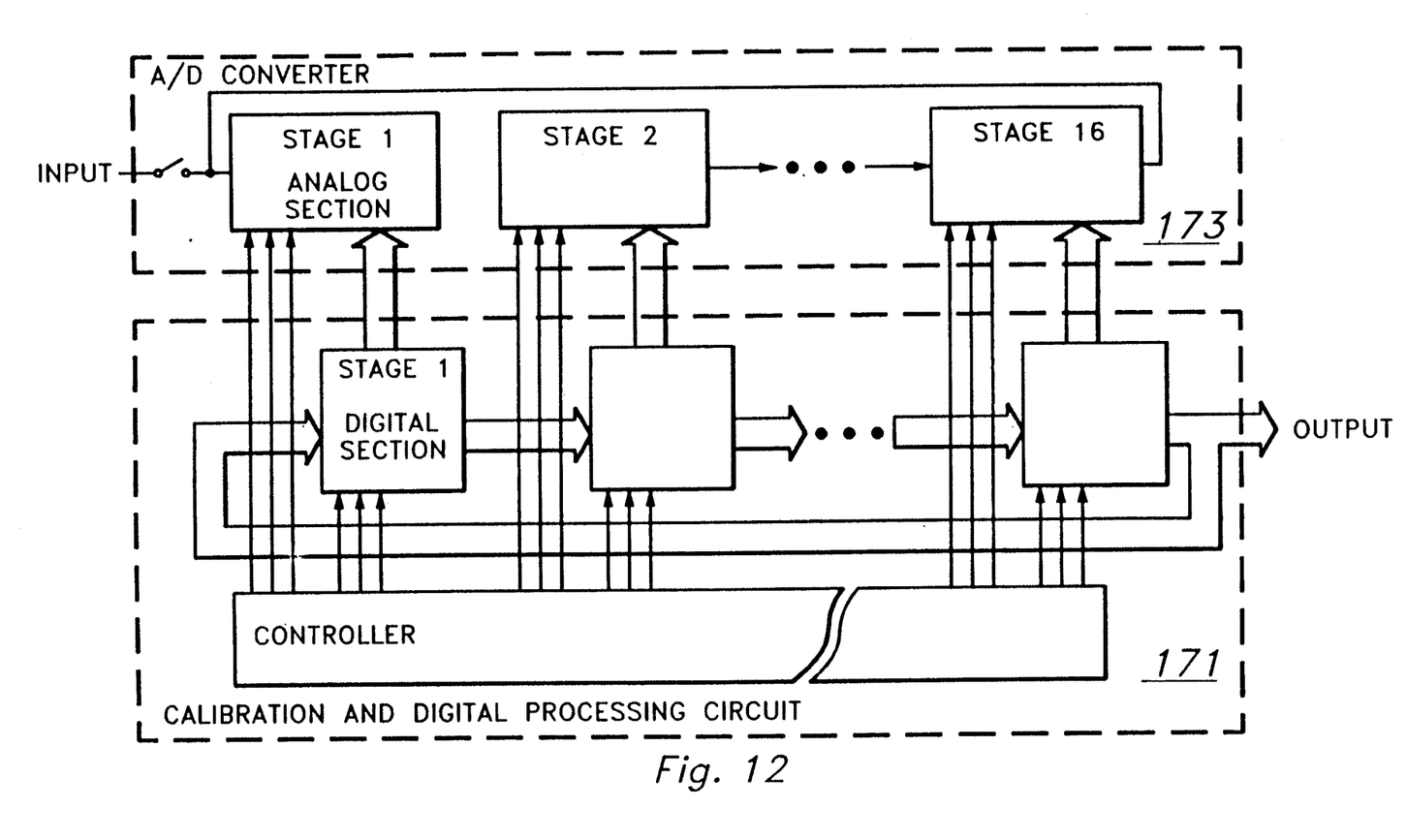
FIG. 12 is a block diagram of an integrated circuit comprising an analog-to-digital converter embodying the invention and having an external digital control circuit.

FIG. 12 depicts an integrated circuit 173 on which the 16 stage analog-to-digital converter using accuracy bootstrapping described above is fabricated. Integrated circuit 171 contains the digital calibration and processing circuitry. The controller in integrated circuit 171 can be replaced by a general purpose computer or microprocessor. The steps of the calibration cycle illustrated in FIG. 5 are the operations the controller must perform, and one knowledgeable in the art can readily design a controller to perform those steps. The digital hardware may also perform the multiplication and adding operations instead of placing that circuitry in each A/D stage, if that arrangement proves to be efficient.

Figure 13:
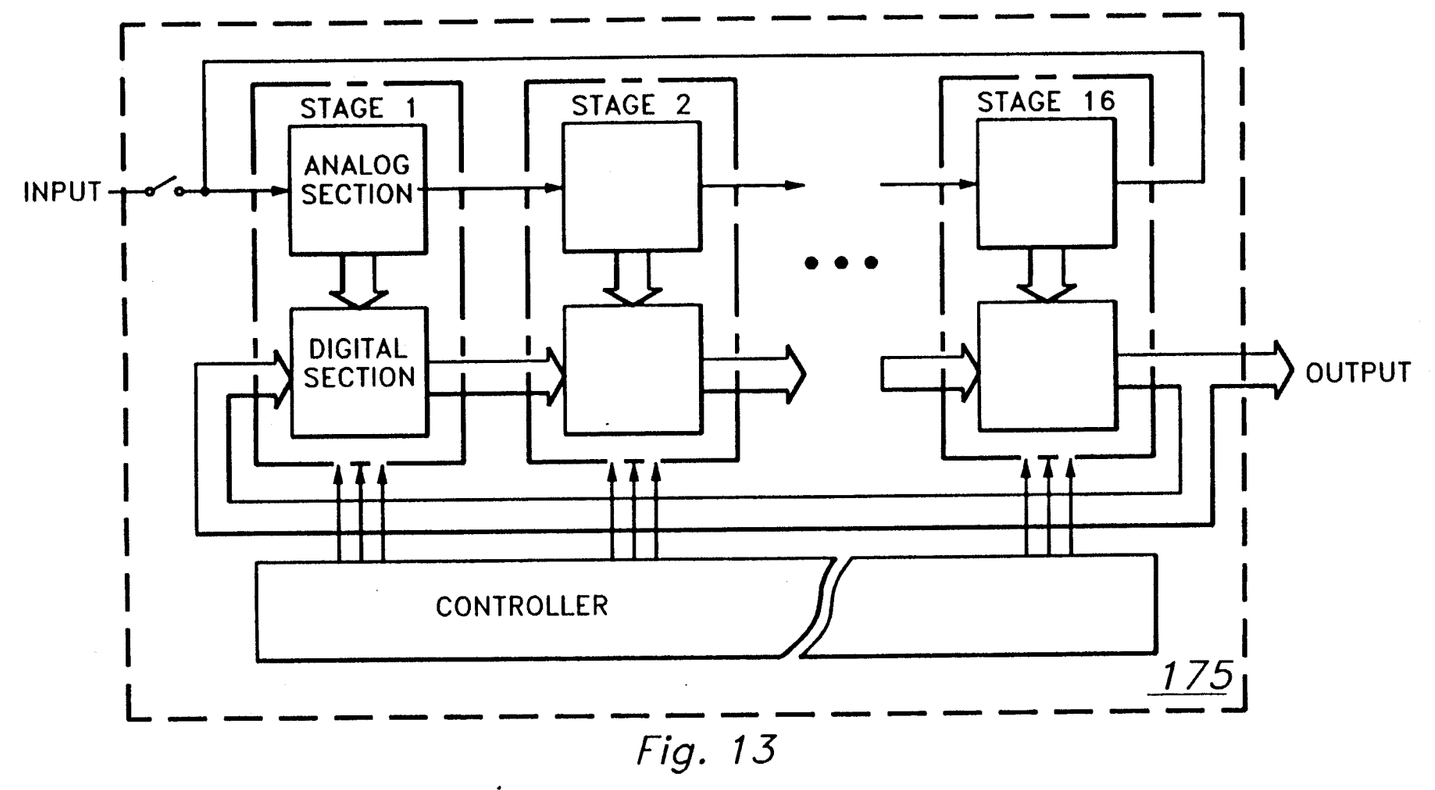
FIG. 13 is a block diagram of an integrated circuit comprising an analog-to-digital converter system embodying the invention and also comprising the controller and computation logic required.

FIG. 13 depicts an integrated circuit on which is implemented the complete 16 stage analog-to-digital system described above. The digital logic provides control of the calibration steps, the reconfiguration and measurement, computes the updates for the adjustable elements, stores them in memory, and eliminates the need for the separate controller IC in FIG. 12.

A few preferred embodiments have been described in detail hereinabove. It is to be understood that the scope of the invention also comprehends embodiments different from those described, yet within the scope of the claims.

For example, color display devices can be raster-scanned cathode ray tubes or other raster-scanned devices; devices that are not raster-scanned and have parallel line or frame drives; color printers, film formatters, or other hard copy displays; liquid crystal, plasma, holographic, deformable micromirror, or other displays of non-CRT technology; or three-dimensional or other devices using nonplanar image formation technologies.

"Microcomputer" in some contexts is used to mean that microcomputer requires a memory and "microprocessor" does not. The usage herein is that these terms can also be synonymous and refer to equivalent things. The phrase "processing circuitry" comprehends ASICs (application specific integrated circuits), PAL (programmable array logic), PLAs (programmable logic arrays), decoders, memories, non-software based processors, or other circuitry, or digital computers including microprocessors and microcomputers of any architecture, or combinations thereof. Words of inclusion are to be interpreted as nonexhaustive in considering the scope of the invention.

Internal and external connections can be ohmic, capacitive, direct or indirect, via intervening circuits or otherwise. Implementation is contemplated in discrete components or fully integrated circuits in silicon, gallium arsenide, or other electronic materials families, as well as in optical-based or other technology-based forms and embodiments. It should be understood that various embodiments of the invention can employ or be embodied in hardware, software or microcoded firmware. Process diagrams are also representative of flow diagrams for microcoded and software based embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A system physically realizing a transfer function and having improved accuracy and fast calibration, comprising:

a plurality of stages, each stage having one or more transfer functions defining a predetermined relationship between inputs and outputs, said plurality of stages coupled together to implement the system transfer function;

control logic for selectively reconfiguring said stages, for further coupling any one of said stages to the remaining ones so that the output of said one of said stages is coupled to the input of at least one other of said stages;

control logic for selectively causing said stages to transmit at their output responses to an input which enable characterization of transfer functions within said stages; and operable to allow any one of said stages to be configured as the first stage in a sequence made up of at least one other of said stages, the first stage outputting responses indicative of the characteristics of the transfer functions within it in response to selective excitation, the remaining stages capturing said output responses from said first stage as a measurement of one or more of the transfer functions of said first stage.

2. The system of claim 1, wherein each of said stages further comprises:

fixed and adjustable elements, coupled to implement one or more predetermined transfer functions; and logic for selectively coupling the output of said stage to one or more of said elements so that at a predetermined time the value at the output represents the value of the elements so selectively coupled.

3. The stages of claim 2, wherein each stage further comprises control logic coupled to said adjustable elements and further coupled to adjustment input signals to enable adjustments of the values of said adjustable elements.

4. The system of claim 1, wherein said control logic for selectively reconfiguring said stages further comprises logic for coupling said plurality of stages in a serial fashion, operable to allow the output of the first stage in response to selective excitation to be captured by the remaining stages as a measurement of the transfer function of said first stage.

5. The serially coupled stages of claim 4, wherein each of said stages additionally comprises storage circuitry operable for storing and selectively outputting the captured output of said first stage.

6. The serially coupled stages of claim 5, wherein the storage circuitry in each of said stages may be selectively modified for use in updating the adjustable elements of said stage in response to the measurement of the transfer function of said stage.

7. The system of claim 1, wherein said first stage selectively outputs responses indicative of one or more of the transfer functions within it in response to selective excitation comprising coupling the input of said first stage to one or more reference signals.

8. An analog-to-digital converter implemented using accuracy bootstrapping for calibration, comprising:

a plurality of analog-to-digital converter stages coupled together;

switching circuitry for reconfiguring said plurality of converter stages so that any one can be first in a serial chain, followed by the remainder of said plurality of converter stages;

control circuitry operable to cause any one of said stages to output signals indicative of values of one or more of the fixed elements within said stage;

sequencing circuitry operable for causing a first stage in the serial configuration of converter stages to output signals indicative of the value of fixed components within it, and causing the resulting output to be input to the remaining stages in said serial configuration of stages, the remaining stages taking a measurement indicative of the value of the fixed components within said first stage.

9. The analog to digital converter of claim 8, wherein each of said plurality of analog-to-digital stages further comprises circuitry operable to output a digital code representative of the value at the input.

10. The analog-to-digital converter of claim 9, and further comprising:
storage circuitry coupled to said plurality of analog-to-digital converter stages for storing said digital codes; and
mapping circuitry operable for mapping said digital codes onto adjustable coefficients.

11. The analog-to-digital converter of claim 10, and further comprising computing circuitry coupled to said mapping circuitry and said storage circuitry, operable for computing said adjustable coefficients and storing new values of adjustable coefficients in said storage circuitry.

12. The analog-to-digital converter of claim 11, wherein said sequencing circuitry further comprises circuitry coupled to said control, storage and mapping circuitry, operable for causing a first stage in the serial configuration of converter stages to output signals indicative of the value of one or more fixed components within it, causing the outputs to be measured by the remaining serially configured stages, causing the resulting measurement to be output by the remaining serially configured stages as digital codes, causing said digital codes to be stored, causing the said stored measurement to be used for computing a new adjustable coefficient and causing said new adjustable coefficient to be stored.

13. An integrated circuit implementing an analog-to-digital converter, comprising:
a plurality of analog-to-digital converter stages, each having a digital code as an output, each having an analog output, serially coupled together;
switching circuitry for reconfiguring said plurality of converter stages so that any one can be first in a serial chain, followed by the remainder of said plurality of converter stages;
control circuitry operable to cause any one of said stages to selectively output signals indicative of the values of one or more fixed elements within said stage;
storage circuitry for storing said digital codes, and for mapping said digital codes onto adjustable coefficients;
computing circuitry for computing said adjustable coefficients and storing new values in said storage circuitry;
sequencing circuitry coupled to said control, storage and computing circuitry and operable for causing a first stage in the serial configuration of converter stages to output the value of fixed components within it, causing the resulting measurement made on the said value to be stored, causing the said stored measurement to be used for computing a new adjustable coefficient, and operable for storing said new adjustable coefficient.

14. The integrated circuit of claim 13, and further comprising:

output terminals coupled to said plurality of converter stages, operable for outputting said digital codes.

15. The integrated circuit of claim 14, and further comprising:
analog output terminals coupled to one or more of said plurality of converter stages, operable for selectively transmitting the analog output of said stages.

16. A method for implementing a system having improved accuracy and fast calibration, comprising the steps of:
providing a series of stages, each implementing a transfer function using fixed and adjustable elements, the series of stages coupled together and implementing a desired system transfer function;
providing control circuitry operable to reconfigure the series of stages, so that any one stage may be selectively placed first in the series, and the remaining stages may be placed after the one stage;
providing storage circuitry operable to store adjustable parameters for each of said series of stages;
providing circuitry operable to cause any one of said stages to output signals indicative of the value of fixed elements within said one of said stages;
providing computation circuitry operable to compute new values for the adjustable elements within any one of said stages;
configuring the series of said stages so that any one selected stage is placed first, and the remaining stages follow the said one selected stage;
controlling the output of said selected stage so that the remaining series of stages measure the output indicative of the value of one of the fixed elements of said selected stage;
storing the measurement of the fixed element value output by the selected stage;
again controlling the output of the selected stage and measuring until measurements indicative of all of the fixed values have been stored;
computing new adjustable element values for the adjustable elements in the selected stage, and updating the adjustable elements by storing those values;
replacing the selected stage with another one of said stages, and repeating the last four stops;
continuing the last five steps until the adjustable elements of all stages have been updated.

17. The method of claim 16, and further comprising the step of repeating the iterations for the entire series of stages until the values of the adjustable elements no longer change from iteration to iteration.

18. A method for implementing an analog-to-digital converter having improved accuracy and fast calibration, comprising the stops of:
providing a plurality of analog-to-digital converter stages, each having a transfer function, each having a digital code as an output, coupled together to implement a system transfer function;
providing switching circuitry for reconfiguring said plurality of converter stages so that any one can be first in a chain, followed by the remainder of said plurality of converter stages;
providing control circuitry operable to cause any one of said stages to output signals indicative of the transfer function within said stage;

providing sequencing circuity coupled to said converter stages for reconfiguring said converter stages;

configuring said converter stages to select one of said stages as the first stage, the remaining stages coupled to said first stage and each other;

causing the said first stage to output one or more values indicative of the characteristics of the transfer function within it;

using the remaining stages to measure the transfer function characteristics of said first stage;

selecting another stage to be the first stage;

reconfiguring the configuration of the converter stages of the system, and repeating the last three steps until the characteristics of the transfer function of each of said plurality of converter stages have been measured.

19. The method of claim 18, wherein the stop of providing a plurality of converter stages having a transfer function comprise:

providing fixed and adjustable elements for each of said plurality of converter stages coupled to implement said transfer function.

20. The method of claim 19, wherein the stop of providing switching circuitry for reconfiguring said plurality of converter stages further comprises providing circuitry operable to couple said converter stages in a serial chain, wherein any selected stage can be configured as the first stage in the chain, the remaining stages being coupled serially together and coupled to the selected first stage.

21. The method of claim 20, wherein the step of providing control circuitry operable to cause any one of said stages to output signals indicative of the transfer function within said stage comprises providing circuitry to cause the said one of said stages to output values indicative of the fixed components within the stage.

22. The method of claim 21, wherein the stop of configuring said converter stages to select one of said stages as the first stage, the remaining stages coupled to said first stage and each other comprises configuring said stages in a serial chain, the first stage being the first stage in the chain, the remaining stages being coupled serially to each other and to said first stage.

23. The method of claim 22, wherein the stop of using the remaining stages to measure the transfer function characteristics of said first stage comprises inputting the output of the first stage indicative of the value of fixed elements within the first stage to the serial chain of remaining stages.

24. The method of claim 18, and further comprising the step of providing storage circuitry for storing said digital codes, and for mapping said digital codes onto adjustable coefficients.

25. The method of claim 24, and further comprising the stop of providing computing circuitry for computing said adjustable coefficients and storing new values in said storage circuitry.

26. The method of claim 25, and further comprising the stop of storing the measurements made by the chain of converters from the output of said first stage in said storage circuitry for storing said digital codes.

27. The method of claim 26, and further comprising the stop of computing new adjustable element values for said first stage, and updating the adjustable element values stored in said storage circuitry.

28. The method of claim 27, and further comprising the steps of:

calibrating the system by updating said adjustable elements using the values stored in said storage circuitry for each of said stages; and repeating the calibrations until the measurement of each stage in the system becomes a steady value so that further updates of said adjustable elements are not necessary.

29. A system physically realizing a transfer function and having improved accuracy and fast calibration, comprising:

a plurality of stages, each having one or more transfer functions defining a predetermined relationship between inputs and outputs, said plurality of stages coupled together to implement the system transfer function;

control logic for selectively reconfiguring said stages so that the output of any one of said stages is coupled to the input of at least one other of said stages; and operable to allow any one of said stages to be configured as the first stage in a sequence made up of at least one other of said stages, the first stage outputting responses in response to selective excitation at its input, the remaining stages capturing said output responses from said first stage as a measurement of one or more of the transfer functions of said first stage.

30. The system of claim 29, wherein each of said stages further comprises:

fixed and adjustable elements, coupled to implement one or more predetermined transfer functions; and logic for selectively coupling the output of said stage to one or more of said elements so that at a predetermined time the value at the output represents the value of the elements so selectively coupled.

31. The stages of claim 30, wherein each stage further comprises control logic coupled to said adjustable elements and further coupled to adjustment input signals to enable adjustments of the values of said adjustable elements.

32. The system of claim 29, wherein said control logic for selectively reconfiguring said stages further comprises logic for coupling said plurality of stages in a serial fashion, operable to allow the output of the first stage in response to selective excitation to be captured by the remaining stages as a measurement of the transfer function of said first stage.

33. The serially coupled stages of claim 32, wherein each of said stages additionally comprises storage circuitry operable for storing and selectively outputting the captured output of said first stage.

34. The serially coupled stages of claim 33, wherein the storage circuitry in each of said stages may be selectively modified for use in updating the adjustable elements of said stage in response to the measurement of the transfer function of said stage.

35. The system of claim 34, wherein said first stage selectively outputs responses indicative of one or more of the transfer functions within it in response to selective excitation comprising coupling the input of said first stage to one or more reference signals.

36. An analog-to-digital converter implemented using accuracy bootstrapping for calibration, comprising:

a plurality of analog-to-digital converter stages coupled together;

switching circuitry for reconfiguring said plurality of converter stages so that any one can be first in a serial chain, followed by the remainder of said converter stages;

control circuitry operable to cause any one of said stages to output signals indicative of the values of the fixed elements within said stage; and sequencing circuitry operable for causing a first stage in the serial configuration of converter stages to output signals indicative of the value of fixed components within it, the remaining stages taking a measurement of said output signals which is indicative of the value of the fixed components within said first stage.

37. The analog-to-digital converter of claim 36, and further comprising:

storage circuitry coupled to said plurality of analog-to-digital converter stages for storing said digital codes; and mapping circuitry operable for mapping said digital codes onto adjustable coefficients.

38. The analog-to-digital converter of claim 37, and further comprising computing circuitry coupled to said mapping circuitry and said storage circuitry, operable for computing said adjustable coefficients and storing new values of adjustable coefficients in said storage circuitry.

39. The analog-to-digital converter of claim 38, wherein said sequencing circuitry further comprises circuitry coupled to said control, storage and mapping circuitry, operable for causing a first stage in the serial configuration of converter stages to output signals indicative of the value of one or more fixed components within it, causing the outputs to be measured by the remaining serially configured stages, causing the resulting measurement to be output by the remaining serially configured stages as digital codes, causing said digital codes to be stored, causing the said stored measurement to be used for computing a new adjustable coefficient and causing said new adjustable coefficient to be stored.

40. A method for implementing a system having improved accuracy and fast calibration, comprising the steps of:

providing a series of stages, each implementing a transfer function using fixed and adjustable elements, the series of stages coupled to implement a desired system transfer function;

providing control circuitry operable to reconfigure the series of stages, so that any one stage may be selectively placed first in the series, the remaining stages following;

providing storage circuitry operable to store adjustable parameters for said series of stages;

providing circuitry operable to cause one or more of said stages to output signals indicative of the value of said fixed elements within said stages;

configuring the series of said stages so that any one selected stage is placed first, and the remaining stages follow the said one selected stage;

controlling the output of said selected stage so that the remaining series of stages measure the output indicative of the value of one or more of the fixed elements of said selected stage;

storing the measurement of the fixed element values output by the selected stage;

computing new adjustable element values for the adjustable elements in the selected stage, and updating the adjustable elements values;

replacing the selected stage with another one of said stages, and repeating the last four steps; and continuing the last five steps until the adjustable elements of all stages have been updated.

41. The method of claim 40, and further comprising the step of repeating the iterations for the entire series of stages until the values of the adjustable elements no longer change from iteration to iteration.

* * * * *